(12) United States Patent
Rajoo et al.

(10) Patent No.: US 9,761,561 B2
(45) Date of Patent: Sep. 12, 2017

(54) EDGE STRUCTURE FOR BACKGRINDING ASYMMETRICAL BONDED WAFER

(71) Applicant: GLOBALFOUNDRIES Singapore Pte. Ltd., Singapore (SG)

(72) Inventors: Ranjan Rajoo, Singapore (SG); Kai Chong Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 2 days.

(21) Appl. No.: 14/660,949

(22) Filed: Mar. 18, 2015

(65) Prior Publication Data

US 2016/0276310 A1    Sep. 22, 2016

(51) Int. Cl.
*H01L 21/304* (2006.01)
*H01L 25/065* (2006.01)
*H01L 25/00* (2006.01)
*H01L 21/768* (2006.01)

(52) U.S. Cl.
CPC ........ *H01L 25/0657* (2013.01); *H01L 21/304* (2013.01); *H01L 21/76898* (2013.01); *H01L 25/50* (2013.01); *H01L 2225/06513* (2013.01); *H01L 2225/06541* (2013.01); *H01L 2225/06555* (2013.01)

(58) Field of Classification Search
CPC .... H01L 25/0657; H01L 25/50; H01L 21/304
See application file for complete search history.

(56) References Cited

U.S. PATENT DOCUMENTS

| | | | | |
|---|---|---|---|---|
| 2006/0079155 A1* | 4/2006 | Nakamura | ............. | B24B 7/228 451/41 |
| 2008/0284037 A1* | 11/2008 | Andry | ................ | H01L 21/6835 257/774 |
| 2015/0270228 A1* | 9/2015 | Tang | ..................... | H01L 23/562 257/620 |

* cited by examiner

*Primary Examiner* — Matthew Landau
*Assistant Examiner* — Krista Soderholm
(74) *Attorney, Agent, or Firm* — Horizon IP Pte Ltd.

(57) ABSTRACT

Semiconductor devices and methods of forming a semiconductor device are disclosed. The device includes a wafer with top and bottom surfaces. The wafer includes edge and non-edge regions. The wafer includes a plurality of devices and partially processed TSV contacts disposed in the non-edge region and a groove disposed at the edge region. The groove enables edges of the wafer to be automatically trimmed off as the wafer is subject to a back-grinding planarization process to expose the TSV contacts in the non-edge region of the wafer.

20 Claims, 14 Drawing Sheets

EDGE STRUCTURE FOR BACKGRINDING ASYMMETRICAL BONDED WAFER

BACKGROUND

Wafer bonding is commonly employed for wafer level 3-D packaging. As technology evolves into the era of sub-micron, there is a desire to integrate/bond different wafers together to form a 2.5D or 3D integrated circuit (IC) package, also known as a wafer stack. After the wafers are bonded to form a wafer stack, the wafer stack is usually subjected to wafer back-grinding processing for reducing the wafer thickness to allow for stacking, high density packaging of ICs and revealing of interconnects for next level integration.

Edge trimming may be required before the back-grinding processes to prevent the wafer edge from chipping or breaking during the back-grinding or bumping processes. However, conventional wafer trimming processes are difficult to control and often lead to poor edge trim width control.

From the foregoing discussion, it is desirable to provide a process for trimming a wafer stack that is easy to control and simple to implement to avoid damage to the wafer edge caused by wafer back-grinding processing.

SUMMARY

Embodiments generally relate to semiconductor device and methods for forming semiconductor devices.

In one embodiment, a semiconductor device is disclosed. The semiconductor device includes a wafer. The wafer includes edge and non-edge regions. The wafer includes a plurality of devices and partially processed TSV contacts disposed in the non-edge region and a groove disposed at the edge region. The groove enables edges of the wafer to be automatically trimmed off as the wafer is subject to a back-grinding planarization process to expose the TSV contacts in the non-edge region of the wafer.

In another embodiment, a method for forming a device is presented. The method includes providing first and second wafers with top and bottom surfaces. The wafers include edge and non-edge regions. The first and second wafers include devices formed in the non-edge region. The method includes forming a groove at the edge region and partially processed TSV contacts at the non-edge region of the first wafer. The first and second wafers are bonded to form a device stack. The bottom surface of the first wafer is subjected to a back-grinding process. The groove in the edge region of the first wafer enables edges of the first wafer to be automatically trimmed off as the back-grinding process exposes the TSV contacts in the non-edge region of the first wafer.

In yet another embodiment, another method for forming a device is presented. The method includes providing first and second wafers with top and bottom surfaces. The first and second wafers include edge and non-edge regions. The first and second wafers include devices formed in the non-edge region. The method includes forming a groove at the edge region and partially processed TSV contacts at the non-edge region of the first and second wafers. The first and second wafers are bonded to form a device stack. The method includes subjecting the bottom surface of the first and second wafers to a back-grinding process. The groove in the edge region of the first and second wafers enables edges of the first and second wafers to be automatically trimmed off as a back-grinding process exposes the TSV contacts in the non-edge region of the first and second wafers.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices and methods for forming devices. The devices may be, for example, semiconductor devices. For example, the semiconductor devices may be ICs. In other embodiments, the devices may be other types of devices, such as micro-electromechanical system (MEMS) devices. In yet other embodiments, the devices may be optoelectronic devices. Embodiments may be employed to form stacked devices, for example, multiple devices stacked together to form a device stack. The device stack may include semiconductor devices. The devices of the stack may be the same type of device. In other embodiments, the device stack may be a combination of different types of devices, for example, IC and MEMS devices stacked together.

The devices may be incorporated into or used with, for example, CMOS products, electronic products, computers, cell phones, and personal digital assistants (PDAs). The devices may also be incorporated into other types of products. In general, the embodiments are further applicable to wafer-to-chip and chip-to-chip bonding, including MEMS, semiconductor IC or other hybrid devices. The embodiments employ a groove to protect the edges of a wafer from chipping or breakage during a back-grinding process. The embodiments may further include a protection seal to protect the edges of a wafer and to minimize or avoid contamination during subsequent processes.

Figure 1A:
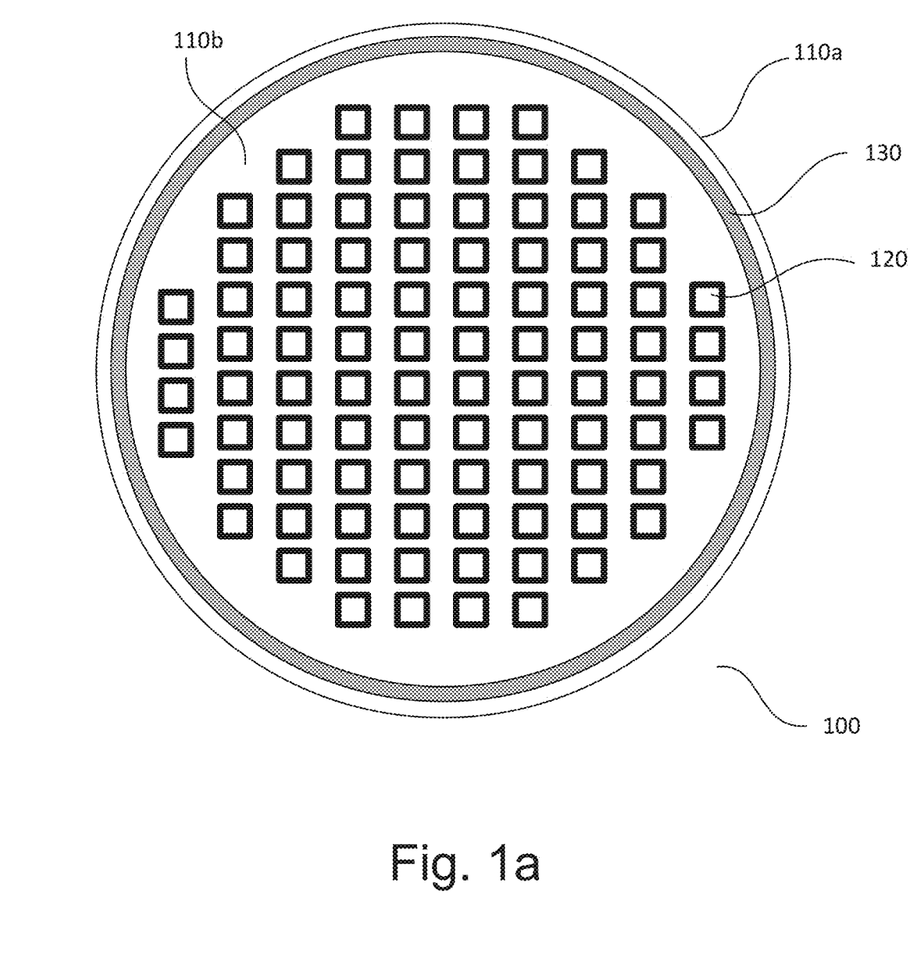
FIGS. 1a-1c show plan and side views of various embodiments of a semiconductor wafer.
Figure 1B:
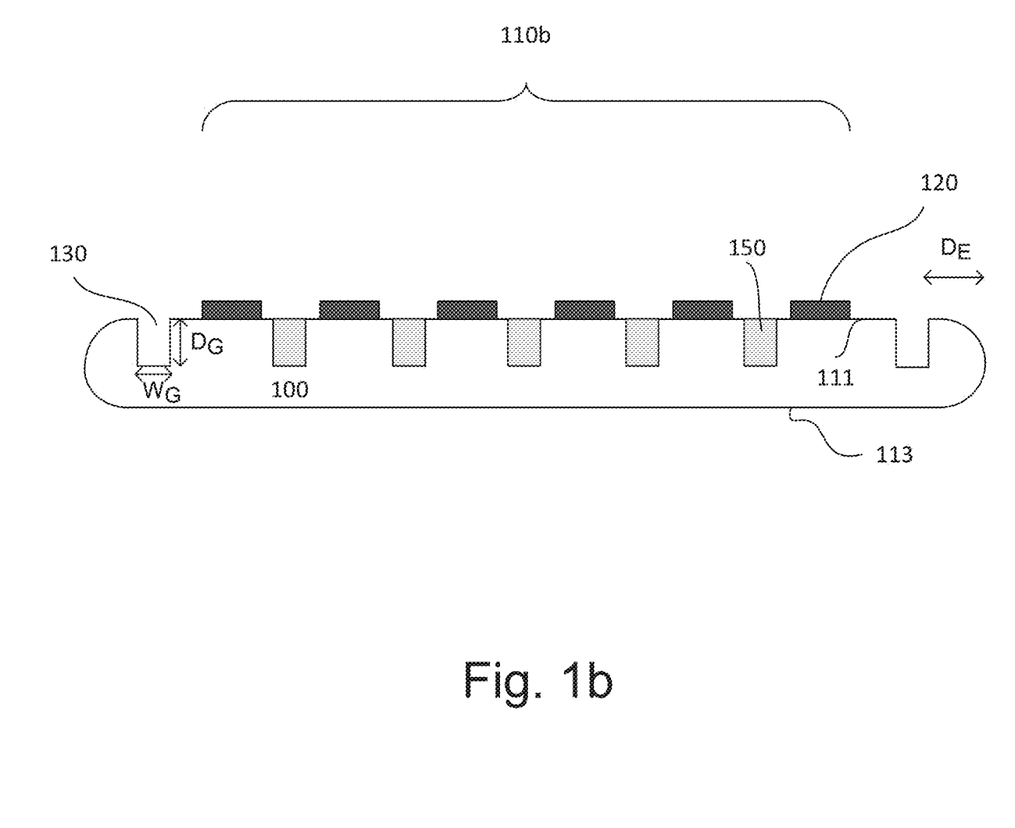
Figure 1C:
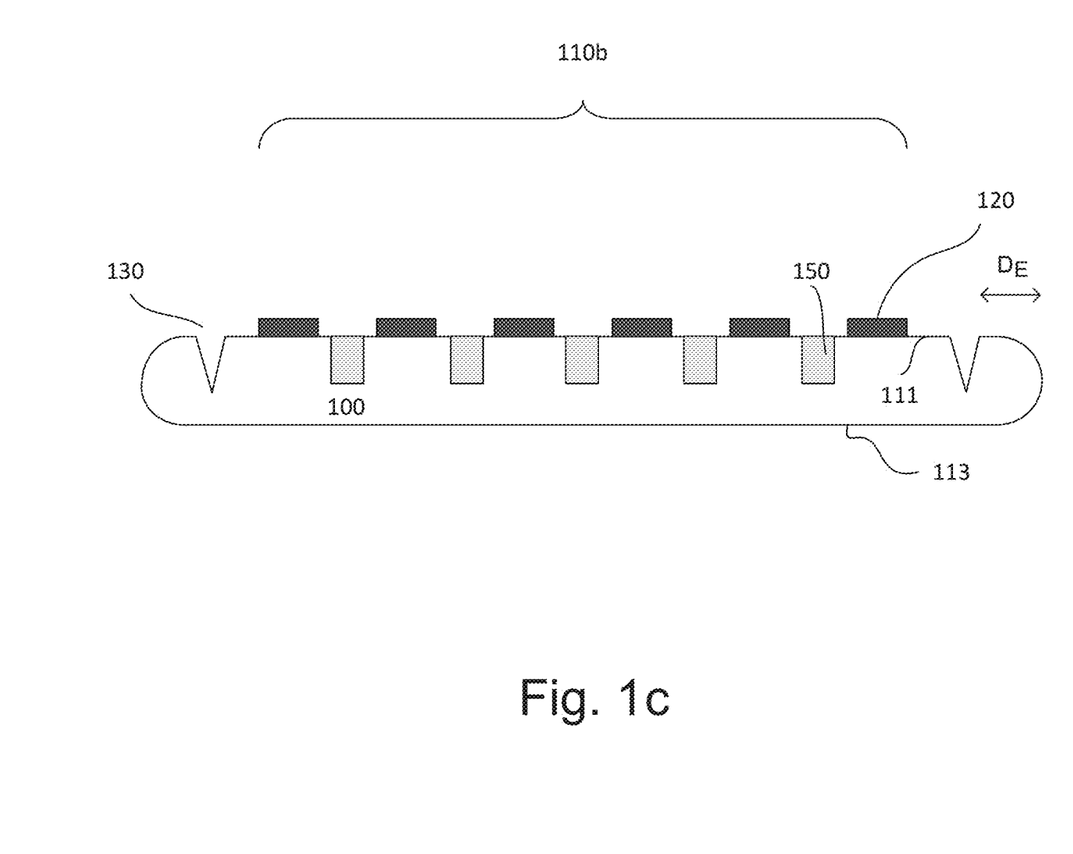

FIG. 1a shows a simplified plan view of an embodiment of a semiconductor wafer 100 while FIGS. 1b-1c show corresponding side views of various embodiments of the semiconductor wafer. The semiconductor wafer, for example, may be a silicon wafer. Other types of wafers may also be useful. For example, the wafer may be a germanium (Ge), silicon-germanium alloy (SiGe), silicon-on-insulator (SOI), silicon-on-sapphire (SOS), gallium-arsenic (GaAs) or any other suitable semiconductor materials. The wafer may include through silicon via (TSV) contacts (not shown in FIG. 1a, but shown as 150 in FIGS. 1b-1c).

The edge of semiconductor wafer 100 may be beveled or rounded, as shown. However, other types of edges may also be useful. The wafer, as shown, has a circular shape. Depending on the type of device, the wafer may include a notch (not shown) to indicate the crystal orientation of the wafer. Other techniques for indicating the crystal orientation may also be useful. Additional indicators may also be included to indicate the dopant type of the wafer.

The wafer 100, in one embodiment, is a processed wafer. For example, devices 120 are located on an active surface 111 of the processed wafer. The active surface may be referred to as the top surface while the opposing surface may be the inactive or bottom surface 113. The devices, for example, are formed in parallel. The devices, for example, are arranged in rows along a first (x) direction and columns along a second (y) direction. As shown, full or complete devices are disposed on the active surface. For example, complete devices are disposed in a device or die region 110b on the active surface of the wafer.

In one embodiment, the wafer 100 is prepared for bonding with another wafer. Bonding two or more wafers together forms a wafer stack. To facilitate wafer stacking, the wafer may include through silicon via (TSV) contacts 150 as shown in FIGS. 1b and 1c. At this stage of processing, the TSV contacts are partially processed. For example, the TSV contacts are formed by forming a plurality of TSV holes which extend from the active (or top) surface and partially through the wafer, followed by filling the TSV holes with a conductive layer. A planarization process may be performed resulting in the TSV contacts as shown. In other words, the bottom of the TSV contacts does not extend through to the inactive (or bottom) surface of the wafer while the top of the TSV contacts at the active surface may be exposed.

Referring back to FIG. 1a, an edge region 110a surrounds the circumference or edge of wafer 100. The edge region 110a may be devoid of devices but may instead include a groove 130. As shown in FIG. 1a, the groove, for example, is provided in the form of a circular ring structure for a wafer with circular shape. The groove may be provided in the form of a square or rectangular structure for a wafer of square or rectangular shape. It is understood that the groove may be provided in other suitable forms, depending on the shapes of the wafer. Referring to FIG. 1b, the groove 130 may have a depth $D_G$ of about 0.010 mm-0.5 mm, a width $W_G$ of about 0.010 mm-0.5 mm. Other suitable depth and width dimensions of the groove 130 may be useful. The groove may be provided from a distance $D_E$ of about 100 μm measured from the circumference of the wafer. Other suitable distance of groove 130 from the wafer circumference or edge may also be useful, as long as the groove is located sufficiently close to the circumference of the edge while also able to expose a notch of the underlying wafer during wafer stacking or bonding as will be described later.

As shown in FIG. 1b, the groove 130 has straight sidewalls and resembles a rectangular shape when viewed from the side, whereas FIG. 1c shows groove 130 having tapered sidewalls and resembling a reverse triangular shape when viewed from the side. In other embodiments, having a groove 130 with irregular side walls or resembling other shapes, for example, a square, when viewed from the side may also be useful.

The groove 130 may be formed by various techniques, for example, the use of a dicing blade, by dry/wet etching or by use of a laser. Other suitable techniques may also be used to form the groove. In one embodiment, the groove may be formed simultaneously with the formation of the plurality of TSV holes and MEMS device fabrication. Alternatively, the groove may be formed prior to or after the formation of the plurality of TSV holes. The use of laser and dicing blade, for example, provides flexibility as the shape of the groove could be varied.

Figure 2A:
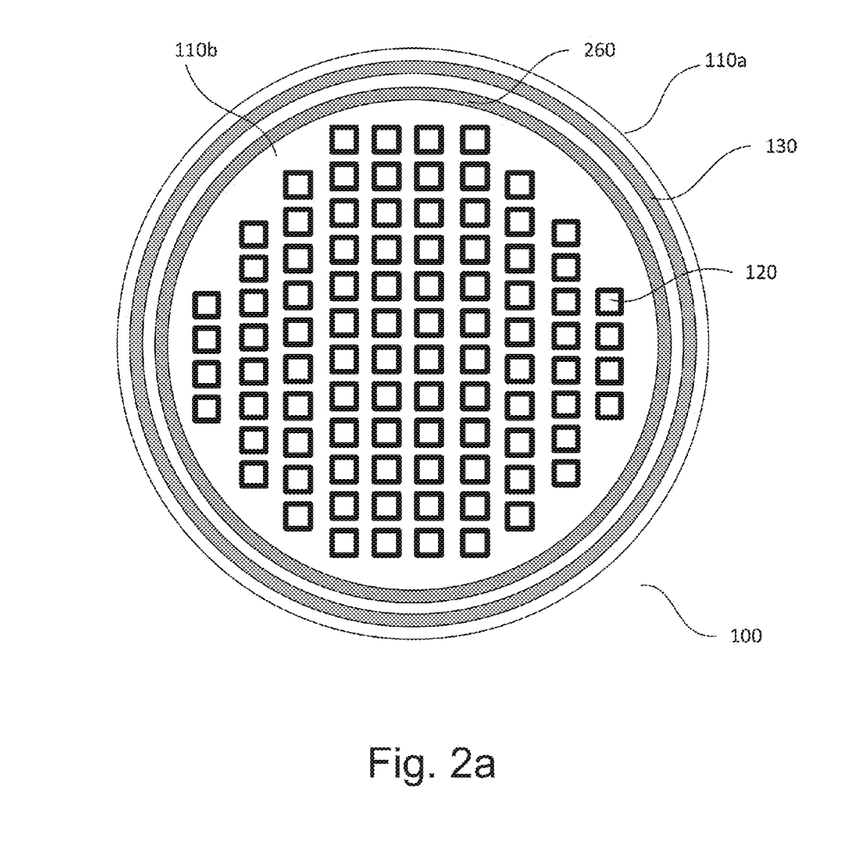
FIGS. 2a-2b show plan and side views of another embodiment of a semiconductor wafer.
Figure 2B:
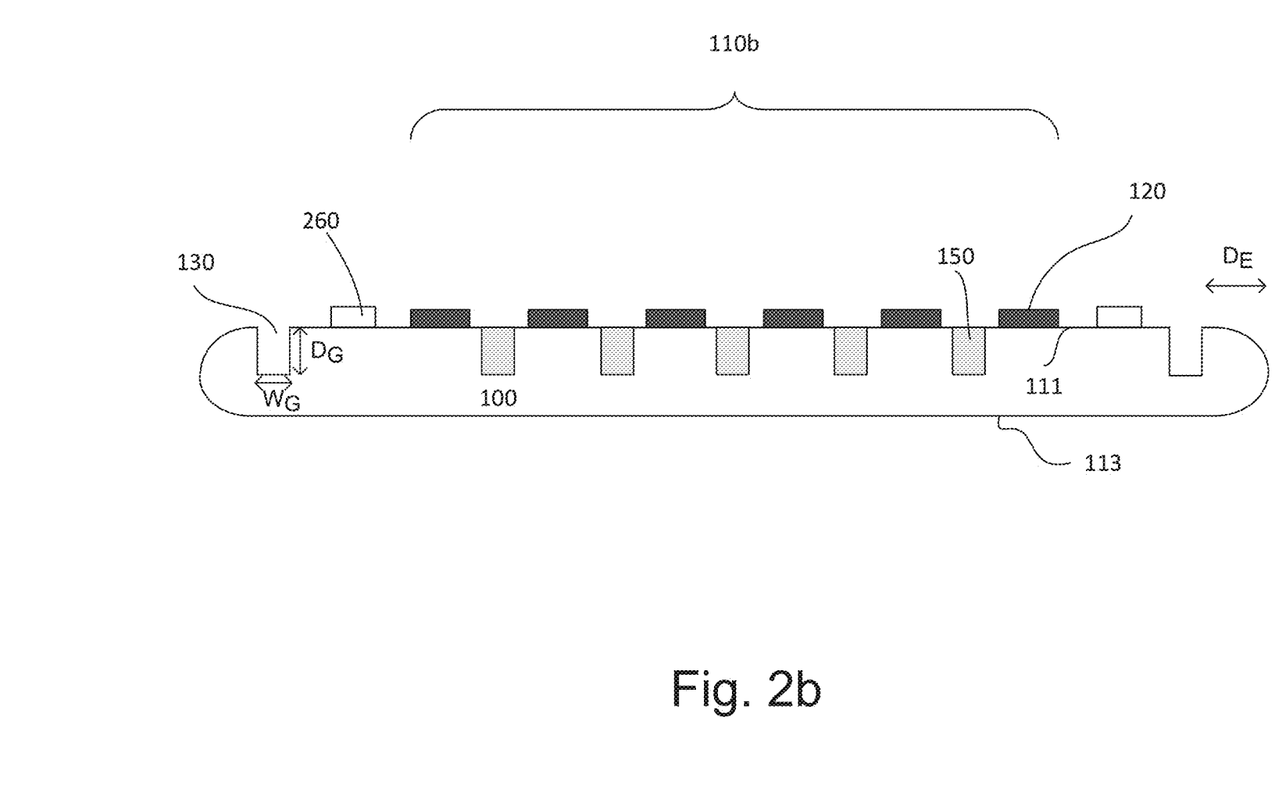

FIGS. 2a-2b show plan and side views of another embodiment of a semiconductor wafer. As can be seen, in addition to the groove 130 as described in FIGS. 1a-1c, a protective seal 260 may be provided. The protective seal 260, for example, is formed of a rigid material. For example, the protective seal may be formed of a metal, such as aluminum, copper, gold, tin, their alloys or a combination thereof. Other suitable types of conductive material may also be useful. Alternatively, non-conductive materials may also be useful. The protective seal 260 may be formed on the wafer to, for example, to seal and protect the devices and interconnects on the wafer from environmental conditions of subsequent processing steps.

The protective seal 260 may be formed by, for example, deposition and photolithography. Other methods for forming the protective seal may also be useful. In yet other embodiments, the protective seal 260 may not be necessary. As can be seen, the protective seal 260, if formed, is formed at the periphery of the wafer, but before groove 130. This means that the protective seal as compared to groove 130, is closer to the center of the wafer. In one embodiment, the distance between the protective seal 260 and groove 130 may be about a few μm apart. In one embodiment, the distance of the protection seal 260 from the edge of the wafer may be about 100 μm. Other suitable distance dimensions may also be useful.

The protective seal 260, for example, includes a ring structure. The ring structure, for example, is a continuous ring structure. The ring, as shown, is circular. Providing a protection seal having other shapes may also be useful. For example, the ring may be a serpentine or zigzag ring. Other suitable patterns may also be useful.

FIGS. 3a-3d show an embodiment of a process 300 for stacking wafers. The wafers are similar to those described in FIGS. 1a-1c. As such, common elements may not be described or described in detail.

Figure 3A:
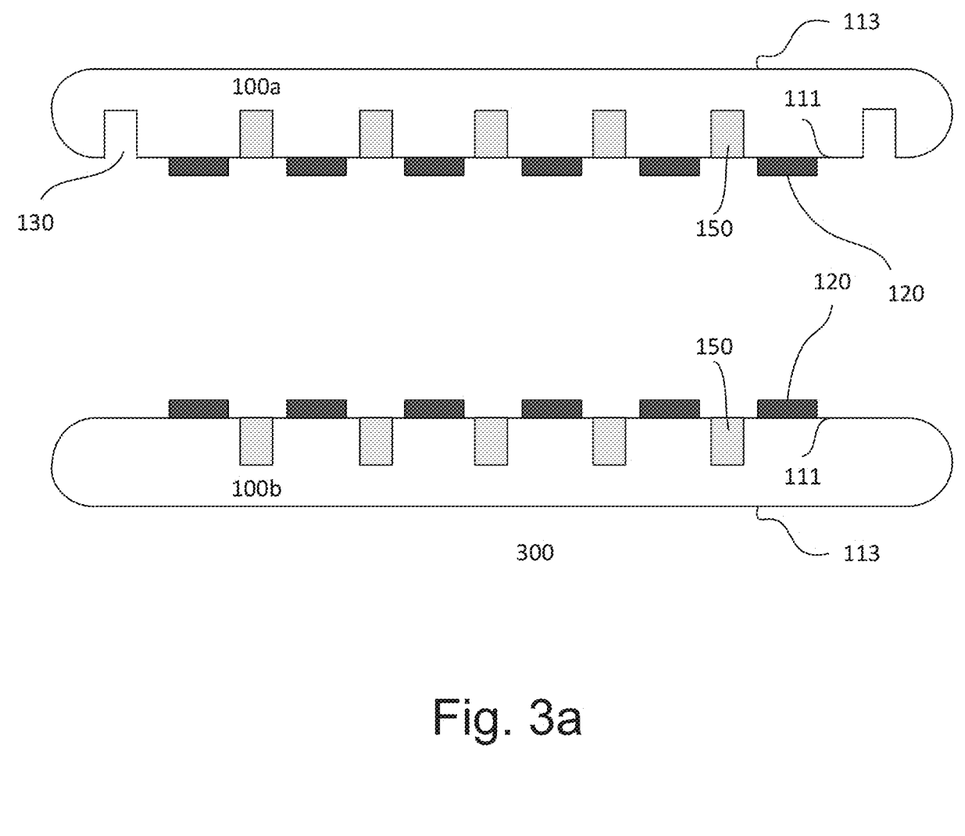
FIGS. 3a-3d show an embodiment of a process for stacking wafers.

Referring to FIG. 3a, first and a second wafers 100a and 100b with at least one of the wafers being similar to that described in FIGS. 1a-1b are provided. For example, one of the wafers includes a groove 130 disposed in an edge region of the wafer. For illustration purpose, the first or top wafer 100a includes a groove 130 disposed in an edge region of the wafer. The first and second wafers, for example, include TSV contacts 150. As can be seen, at this stage of processing, the TSV contacts are partially processed. For example, the TSV contacts extend from the active (or top) surface and partially through the wafer. The bottom of the TSV contacts, as shown, does not extend through to the inactive (or bottom) surface of the wafer. The top of the TSV contacts at the active surface may be exposed. As shown, the wafers are of the same size. Providing wafers with different sizes may also be useful.

Figure 3B:
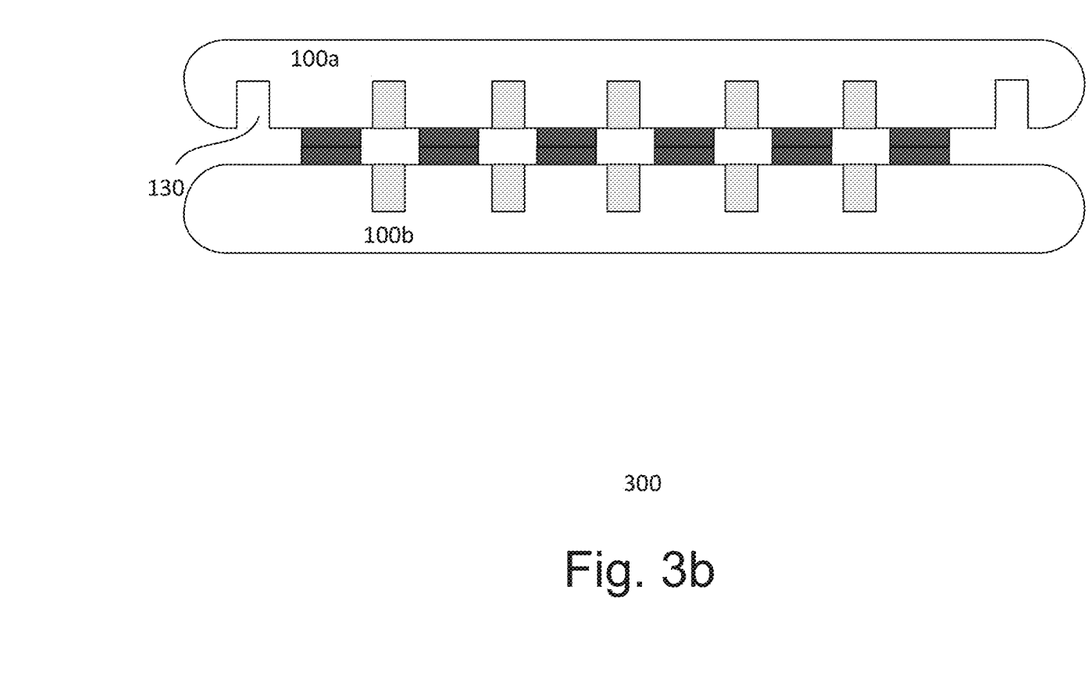

Referring to FIG. 3b, the process continues to stack and bond the first and second wafers together. As shown, the active surfaces of the first and second wafers face each other. In one embodiment, the second or bottom wafer 100b without the groove on its edge region may serve as the base wafer. The base wafer may be, for example, placed on a stationary plate while the first wafer 100a with the groove 130 is moved towards it and pressed against it to form a wafer stack. In another embodiment, the reverse may be true, i.e., the wafer with the groove 130 may serve as the base wafer while the wafer without the groove is being moved towards the wafer with the groove 130. In other implementations, both wafers, for example, may have a groove 130.

The wafers are bonded together. The wafers may be aligned prior to bonding. The wafers may be bonded by bonding processes which include eutectic bonding, thermocompression bonding, solder bonding, glass frit bonding, UV-cured polymer, thermally cured polymer, etc. Other suitable techniques may be employed to bond the first and second wafers.

Figure 3C:
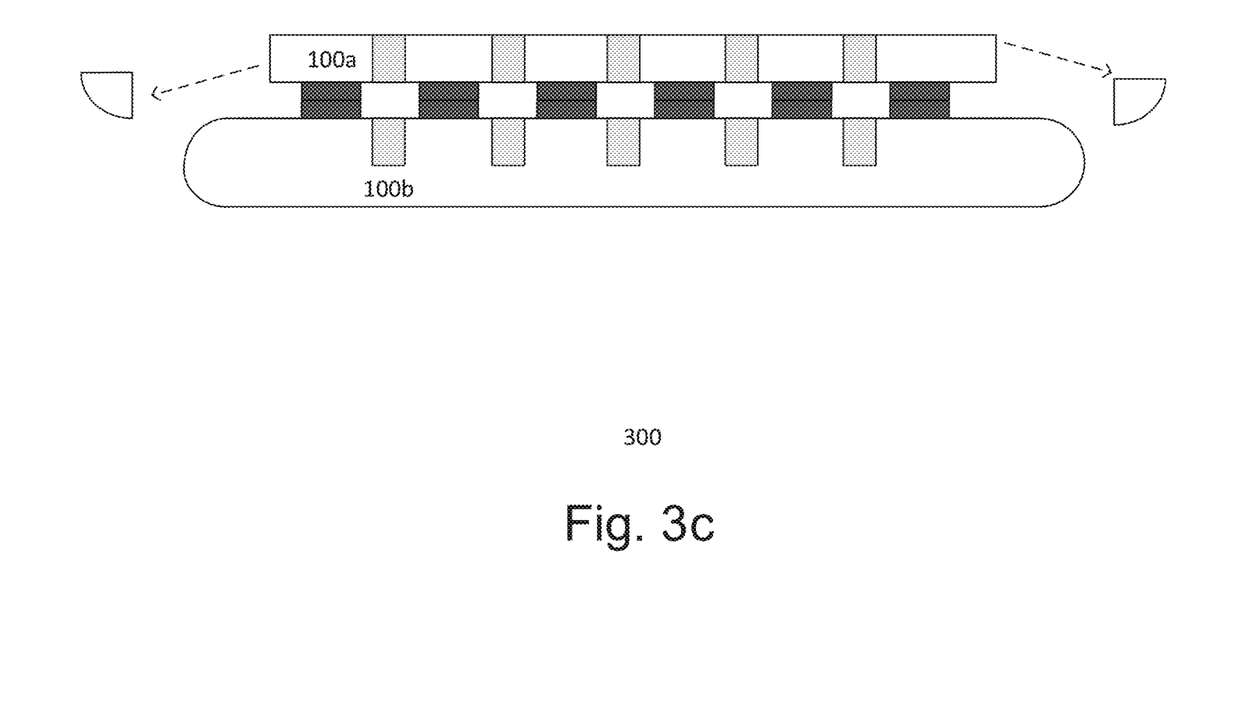

Referring to FIG. 3c, the first wafer 100a with the groove 130 is subject to a back-grinding process to expose the bottom surface of the TSV contacts. As can be seen in FIG. 3c, as the wafer is subject to back-grinding and becomes thinner, the original edges of the wafer will automatically drop off due to the presence of the groove 130, forming a trimmed first wafer with final edges which are about 90° relative to the wafer surface. As such, the use of groove 130 enables the edges of the wafer with the groove 130 to be automatically trimmed off as back-grinding exposes the TSV contacts in the non-edge region of such wafer.

Figure 3D:
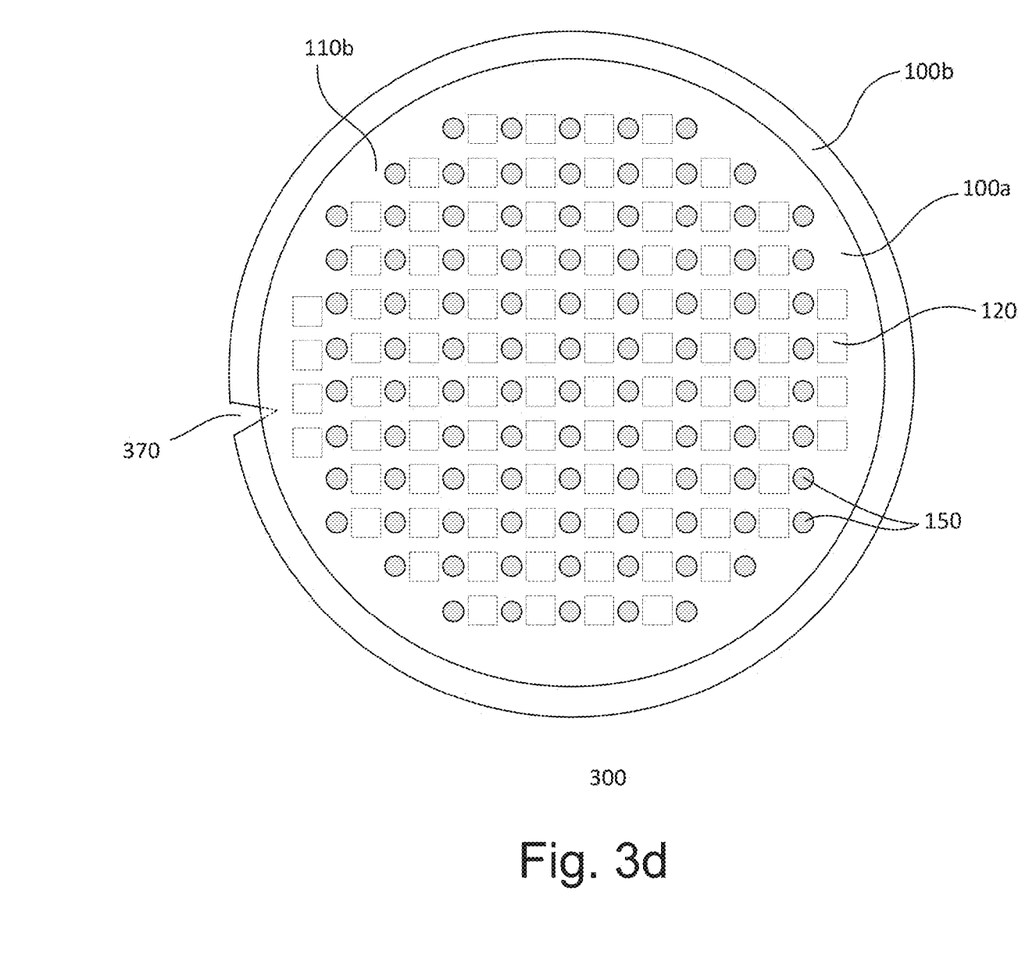

FIG. 3d shows a plan view of FIG. 3c after the back grinding process. As described, the edge region of the first wafer 100a with the groove will automatically drop off as the first wafer is subject to a back-grinding process as the TSV contacts are exposed. As can be seen, the final edge of the first or top wafer of the wafer stack is recessed inward or trimmed compared to the second or bottom wafer. As a result, the notch 370 of the underlying bottom or second wafer 100b which serves as a reference for defining redistribution layer (RDL) pattern later is exposed as the edge region of the first wafer with the groove is drop off during the back grinding process. In addition, the bottom surface of the TSV contacts 150 of the first wafer 100a is exposed as shown in FIG. 3d.

The process continues with RDL processes to form RDL (not shown) on the first or top wafer. The RDL includes conductive traces on an isolation layer and is covered by a passivation layer. Openings are provided in the RDL in which bumps are formed. This provides external connections to the device on the active side through the TSV contacts and RDL. Under Bump metallization may be employed to provide adhesion layer to the RDL and other layers such as a barrier layer, wettable layer, etc., in order to facilitate a subsequent bumping process. Other additional processes may also be performed to complete the formation of the wafer stacks.

The process as described in FIGS. 3a-3d results in advantages. As can be seen, the use or presence of the groove in the first or top wafer can achieve edge trimming to expose the notch of the second or bottom wafer 100b at the same time as back-grinding to expose the bottom surfaces of the TSV contacts 150 in the first wafer. The trimmed first or top wafer of the wafer stack is necessary for RDL process later. Without the edge trimmed for the first or top wafer, the original edges of the first or top wafer having the same width as the width of the bottom wafer of the wafer stack are vulnerable to edge chipping during the RDL process later. Thus, the process as described will result in stable and controlled edge trim dimensions, as well as an increase in throughput and reduction of process steps as it is no longer necessary to perform an additional edge trimming step before performing back-grinding.

Figure 4A:
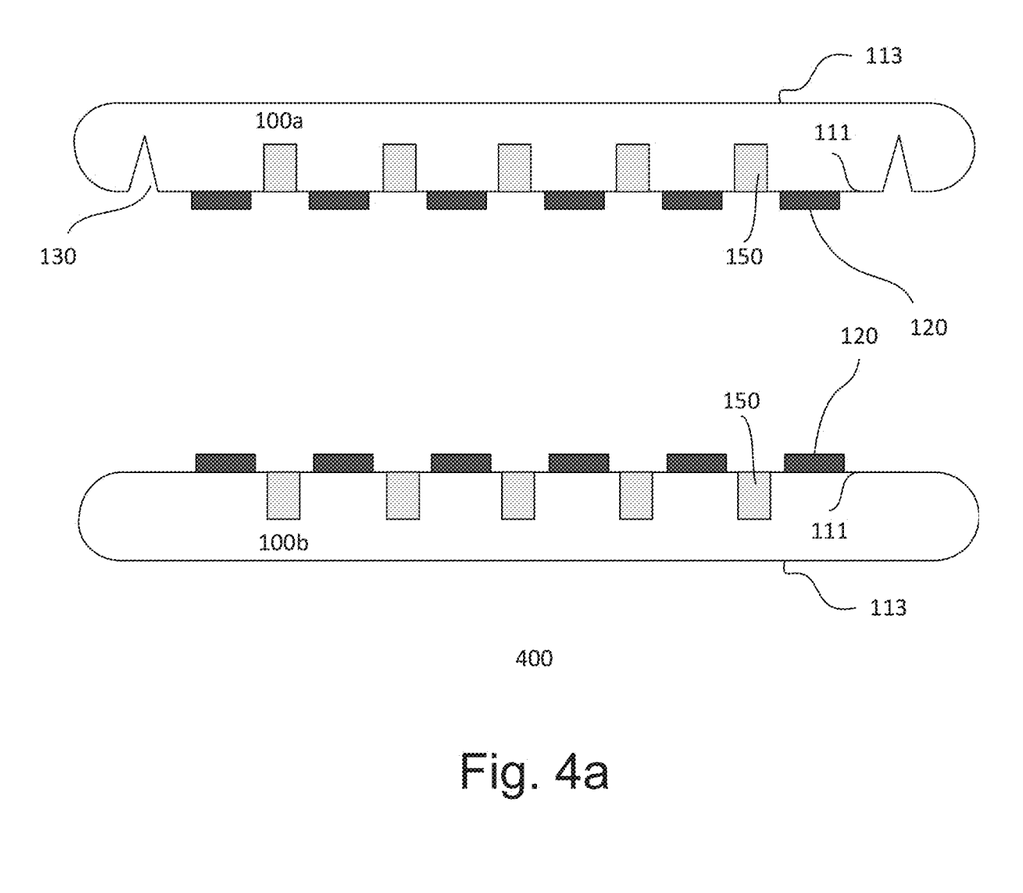
FIGS. 4a-4c show another embodiment of a process for stacking wafers.
Figure 4B:
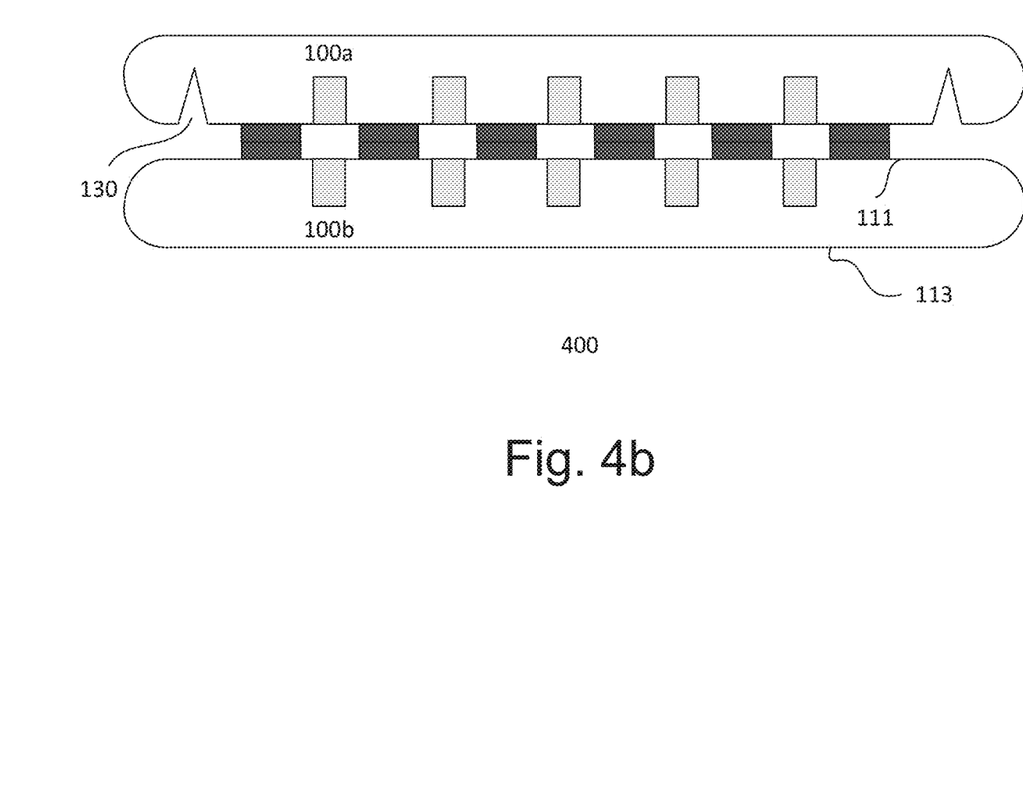
Figure 4C:
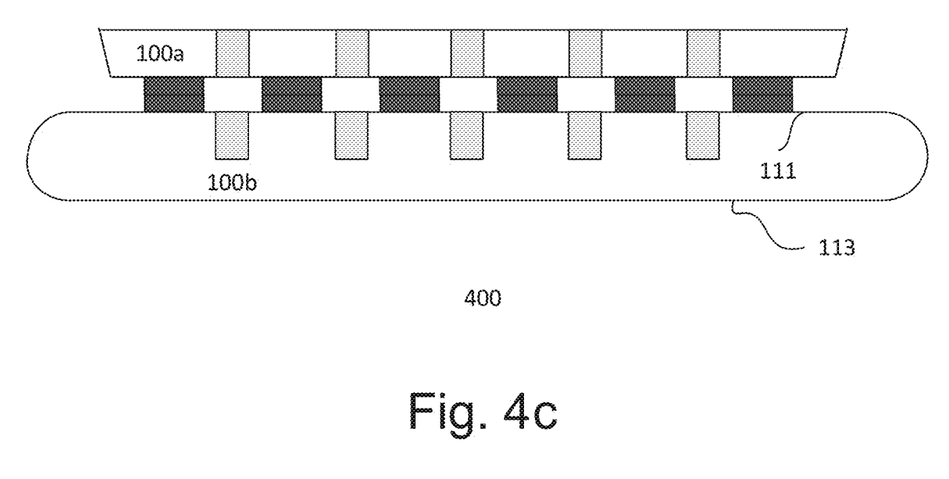

FIGS. 4a-4c show another embodiment of a process 400 for stacking wafers. The process is similar to those described in FIGS. 3a-3d, except in this case, groove 130 has slanted sidewalls and not straight sidewalls such as that shown and described in FIGS. 1a and 1c. As such, common elements may not be described or described in detail.

Referring to FIG. 4a, first and a second wafers 100a and 100b with at least one of the wafers being similar to that described in FIGS. 1a and 1c are provided. For example, one of the wafers includes a groove 130 disposed in an edge region of the wafer. For illustration purpose, the first or top wafer 100a includes a groove 130 disposed in an edge region of the wafer. The groove 130, for example, includes tapered sidewalls and resembling a reverse triangular shape when viewed from the side. As can be seen, at this stage of processing, the TSV contacts of the first and second wafers are partially processed. For example, the TSV contacts extend from the active (or top) surface and partially through the wafer.

Referring to FIG. 4b, the process continues to stack and bond the first and second wafers together. As in FIGS. 3a-3d, the wafer with the groove may or may not be the base wafer and in some embodiments, both wafers may be formed with a groove. As shown, the wafers are stacked and bonded together using various suitable bonding processes such as those described in FIG. 3b.

Referring to FIG. 4c, the first wafer 100a with the groove 130 is subject to a back-grinding process to expose the bottom surface of the TSV contacts. It can be seen that the edges of the wafer with groove 130 in process 400 will also automatically drop off (not shown) as the wafer is subject to back-grinding and becomes thinner thereby enabling the edges of the wafer with the groove to be automatically dropped off as the TSV contacts are exposed. However, the difference between process 300 and process 400 is that, in this case, the original edges will drop off and form a trimmed first wafer 100a with final edges having slanted sidewalls as the TSV contacts are exposed. In other embodiments, providing a groove that will result in final edges with different slanting angles or directions or even final edges that are irregular may also be useful.

The process continues with RDL processes to form RDL (not shown) on the first or top wafer. The RDL include conductive traces on an isolation layer and is covered by a passivation layer. Openings are provided in the RDL in which bumps are formed. This provides external connections to the device on the active side through the TSV contacts and RDL. Under Bump metallization may be employed to provide adhesion layer to the RDL and other layers such as a barrier layer, wettable layer, etc., in order to facilitate a subsequent bumping process. Other additional processes may also be performed to complete the formation of the wafer stacks.

The process as described in FIGS. 4a-4c includes the same or similar advantages as those described for FIGS. 3a-3d. As such, these advantages will not be described.

Figure 5:
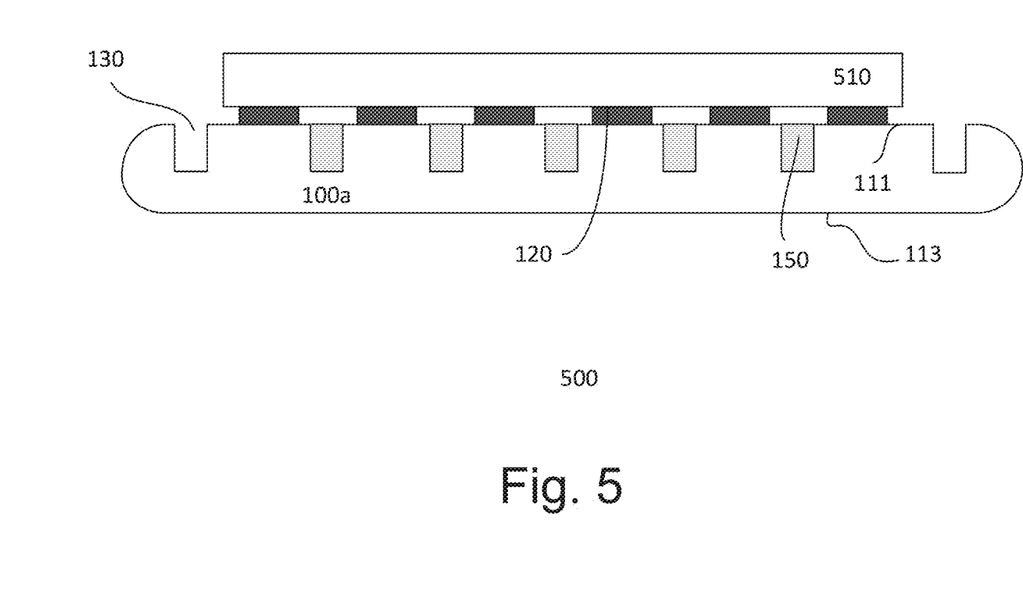
FIG. 5 and FIG. 6 show simplified side views of various embodiments of a semiconductor wafer stack.
Figure 6:
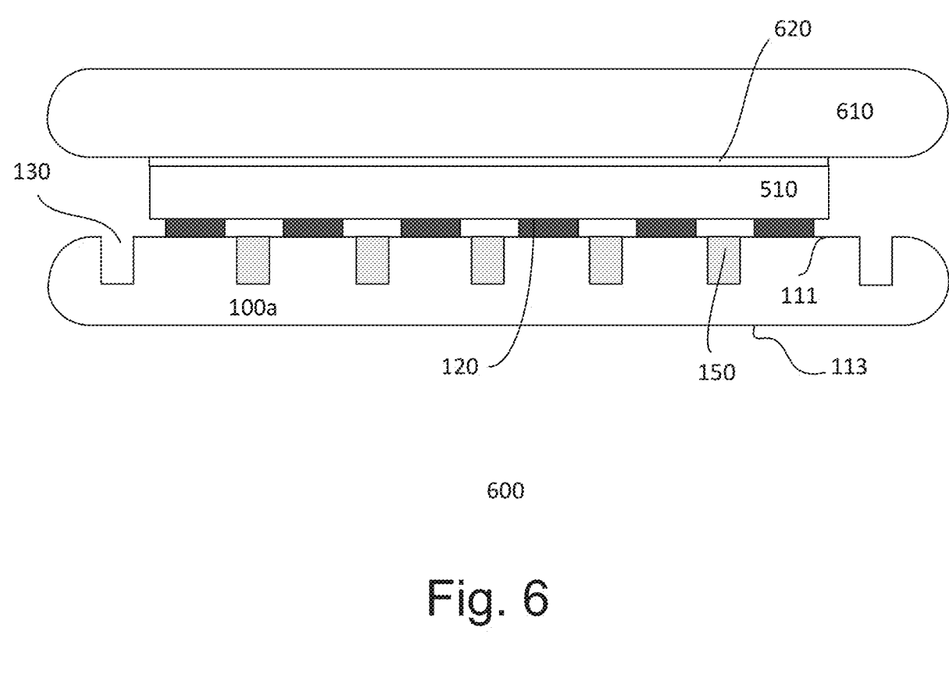

FIG. 5 and FIG. 6 show simplified side views of various embodiments of a semiconductor wafer stack. As can be seen, the exemplary devices and methods may be employed in wafer level bonding to form a wafer stack with multiple wafers. A groove 130 may be formed around the edges of the wafer that will be subject to back-grinding at the same time TSV contacts are formed in such wafer. In another embodiment, the groove may be formed around the edges of the wafer before or after the TSV contacts are formed.

The first wafer 100a, for example, is a CMOS wafer. In one embodiment, the groove may be formed in the CMOS wafer which is to be bonded to a MEMS wafer 510 to form a CMOS-MEMS wafer stack 500 as shown in FIG. 5. The CMOS-MEMS wafer stack may be bonded using suitable wafer bonding techniques such as those described in FIG.

3b. In another embodiment, the bonded CMOS-MEMS wafer stack 600 is attached to a carrier wafer 610 using an adhesive 620 as shown in FIG. 6. Alternatively, the groove may be formed in a MEMS wafer to be bonded to a CMOS wafer 510 to form a CMOS-MEMS wafer stack or the CMOS-MEMS wafer stack is further attached to a carrier wafer 610.

The groove may also be utilized in high volume manufacturing environments as it can be formed simultaneously with the TSV contacts, thereby improving throughput. Furthermore, although the embodiments of the present disclosure are suitable to be employed at the current 200 and 300 mm technology node, the embodiments may be extended to include other technology nodes, including any future nodes such as, for example, 450 mm, 600 mm, etc. The embodiments of the present disclosure are suitable for wafers of square or rectangular shape. It is also applicable to other wafers with any suitable shapes.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
    providing first and second wafers with top and bottom surfaces, the wafers include edge and non-edge regions, the edge region is at a periphery of the wafers, the edge region surrounds the non-edge region of the wafers, wherein the first and second wafers include devices formed on a top surface of the wafer in the non-edge region;
    forming a groove at the edge region and partially processed through silicon via (TSV) contacts at the non-edge region of the first wafer, top surfaces of the TSV contacts are exposed, wherein the second wafer is devoid of the groove;
    bonding the first and second wafers to form a device stack; and
    subjecting the bottom surface of the first wafer to a back-grinding process, wherein the groove in the edge region of the first wafer enables edges of the first wafer to be automatically trimmed off as the back-grinding process exposes the TSV contacts in the non-edge region of the first wafer.

2. The method of claim 1 further comprising forming partially processed TSV contacts at the non-edge region of the second wafer and subjecting the bottom surface of the second wafer to a back-grinding process.

3. The method of claim 1 wherein forming the partially processed TSV contacts comprises forming a plurality of TSV holes which extend from the top surface and partially through the wafer and filling the TSV contact holes with a conductive layer.

4. The method of claim 3 wherein the groove is formed simultaneously with the plurality of TSV holes and the devices in the non-edge region.

5. The method of claim 3 wherein the groove is formed before or after the formation of the plurality of TSV holes and the devices in the non-edge region.

6. The method of claim 1 wherein the groove comprises a depth $D_G$ of about 0.010 mm-0.5 mm and a width $W_G$ of about 0.010 mm-0.5 mm.

7. The method of claim 1 wherein the groove is provided from a distance $D_E$ of about 100 μm measured from circumference of the first wafer.

8. The method of claim 1 wherein the groove has straight sidewalls and resembling a rectangular shape.

9. The method of claim 1 wherein the groove has tapered sidewalls and resembling a reverse triangular shape.

10. The method of claim 1 further comprising forming a protective seal in close proximity with the groove, but closer to center of the wafer as compared with the groove.

11. A semiconductor device comprising:
    a wafer with top and bottom surfaces, the wafer includes edge and non-edge regions;
    a plurality of devices and partially processed TSV contacts disposed in the non-edge region;
    a groove disposed at the edge region, wherein the groove enables edges of the wafer to be automatically trimmed off as the wafer is subjected to a back-grinding planarization process to expose the TSV contacts in the non-edge region of the wafer; and
    a second wafer bonded to the wafer to form a device stack, wherein the second wafer is devoid of a groove at edge region of the second wafer.

12. The semiconductor device of claim 11 wherein the partially processed TSV contacts comprise a plurality of TSV holes which extend from the top surface and partially through the wafer and are filled with a conductive layer.

13. The semiconductor device of claim 11 wherein the groove comprises a depth $D_G$ of about 0.010 mm-0.5 mm and a width $W_G$ of about 0.010 mm-0.5 mm.

14. The semiconductor device of claim 11 wherein the groove is disposed from a distance $D_E$ of about 100 μm measured from circumference of the wafer.

15. The semiconductor device of claim 11 wherein the groove has straight sidewalls and resembles a rectangular shape.

16. The semiconductor device of claim 11 wherein the groove has tapered sidewalls and resembles a reverse triangular shape.

17. The semiconductor device of claim 11 wherein the groove comprises a ring structure.

18. The semiconductor device of claim 11 further comprising a protective seal in close proximity with the groove, but closer to center of the wafer as compared with the groove.

19. A method of forming a semiconductor device comprising:
    providing first and second wafers with top and bottom surfaces, the first and second wafers include edge and non-edge regions, wherein the first and second wafers include devices formed in the non-edge region;
    forming a groove at the edge region and partially processed TSV contacts at the non-edge region of the first and second wafers;
    bonding the first and second wafers to form a device stack; and
    subjecting the bottom surface of the first and second wafers to a back-grinding process, wherein the groove in the edge region of the first and second wafers enables edges of the first and second wafers to be automatically trimmed off as a back-grinding process exposes the TSV contacts in the non-edge region of the first and second wafers.

20. The method of claim 19 wherein the groove comprises a depth $D_G$ of about 0.010 mm-0.5 mm and a width $W_G$ of about 0.010 mm-0.5 mm.

\* \* \* \* \*